United States Patent
Yanka et al.

[11] Patent Number: 5,517,029
[45] Date of Patent: May 14, 1996

[54] DUAL-BAND IR SCANNING FOCAL PLANE ASSEMBLY HAVING TWO MONOLITHICALLY INTEGRATED LINEAR DETECTOR ARRAYS FOR SIMULTANEOUS IMAGE READOUT

[75] Inventors: Robert W. Yanka; Milton L. Noble, both of Liverpool, N.Y.

[73] Assignee: Martin Marietta Corporation, Syracuse, N.Y.

[21] Appl. No.: 253,847

[22] Filed: Jun. 3, 1994

[51] Int. Cl.⁶ .................... H01L 25/065; H01L 27/146; H01L 31/0272
[52] U.S. Cl. .................. 250/332; 250/334; 250/338.4; 250/339.02; 250/370.08; 250/370.14
[58] Field of Search .................. 250/332, 334, 250/338.4, 339.02, 370.08, 370.14

[56] References Cited

U.S. PATENT DOCUMENTS 4,465,940  8/1984  Graff et al. .................. 250/578
4,996,427  2/1991  Noble et al. .................. 250/332
5,036,203  7/1991  Solomon .................. 250/370.06

*Primary Examiner*—Constantine Hannaher
*Attorney, Agent, or Firm*—Paul Checkovich; Stephen A. Young

[57] ABSTRACT

A dual band IR scanning focal plane assembly includes two linear detector arrays in a close spaced configuration monolithically integrated on a common substrate. A medium wave IR staggered element linear array is formed on the front (111)B face of a (111) crystallographically oriented CdZnTe substrate in an MCT layer deposited by the molecular beam epitaxial (MBE) process. A long wave IR staggered element linear array is formed on the back (111)A face of the substrate in an MCT layer deposited by the liquid phase epitaxial (LPE) process. The sets of odd and even rows of the LWIR array on the back face are contiguous, while the sets of odd and even rows of the MWIR array on the front face are close-spaced, the spacing being just wide enough to allow a clear optical path to the underlying linear LWIR array. The arrangement provides simplified spectral separation of the simultaneously readout MWIR and LWIR images.

15 Claims, 5 Drawing Sheets

DUAL-BAND IR SCANNING FOCAL PLANE ASSEMBLY HAVING TWO MONOLITHICALLY INTEGRATED LINEAR DETECTOR ARRAYS FOR SIMULTANEOUS IMAGE READOUT

RELATED APPLICATION

The present application is related to an application entitled "A Dual Band IR Sensor having Two Monolithically Integrated Staring Detector Arrays for Simultaneous, Coincident Image Readout" filed concurrently herewith in the names of the same inventors and assigned to the same Assignee and having Ser. No. 08/253,716.

BACKGROUND OF THE INVENTION

1. Field of the Invention

The invention relates to dual band IR detector arrays in which two spectral images of an optically scanned object field are simultaneously readout, and more particularly to one employing a medium wave IR (MWIR) and a long wave IR (LWIR) linear array.

2. Prior Art

Dual Band IR scanning arrays are required to fill a number of sensor system requirements. Focal plane assemblies with simultaneous readout capability in both bands are particularly important in applications where the object being examined is nearly obscured by the background (or clutter) in one IR band, while more clearly seen in the other IR band. Dual-band arrays using separate juxtaposed LWIR and MWIR arrays are known, but the conventional configurations do not permit closely spaced, dual band detector arrays with nearly coincident readout. Two separate arrays utilizing front side illumination lead to relatively large focal plane assemblies.

SUMMARY OF THE INVENTION

Accordingly it is an object of the present invention to provide an improved focal plane assembly deriving simultaneous dual band IR images of an optically scanned object field.

It is another object of the invention to provide a focal plane assembly deriving simultaneous dual band IR images of an optically scanned object field having an improved physical configuration.

It is a further object of the invention to provide a scanning focal plane assembly providing simultaneous dual band IR image readout having an improved physical configuration in which two linear detector arrays are arranged in a close spaced configuration.

It is still another object of the invention to provide a scanning focal plane assembly providing simultaneous dual band IR image readout having an improved physical configuration in which two close-spaced linear detector arrays are monolithically integrated upon a common substrate.

These and other objects of the invention are achieved in a dual band IR sensor in which optically scanned medium wave and long wave infrared (MWIR, LWIR) images of the same object field are simultaneously readout by a novel, monolithic, IR focal plane assembly.

The focal plane assembly comprises a LWIR transmissive crystalline first substrate having a first face oriented for front side illumination and the second face oriented for back side illumination. An integrated MWIR radiation sensitive linear detector array with photovoltaic (PV) diode pixels forming resolution elements aligned orthogonal to the optical scan direction of the sensor is formed from a first semiconductor layer epitaxially grown on the first face of the substrate. A second integrated LWIR radiation sensitive linear detector array with PV diode pixels forming resolution elements, aligned parallel to and close spaced from said linear MWIR detector array is formed on a second semiconductor layer epitaxially grown on the second face of the substrate, the MWIR pixels being laterally displaced from the optical paths to said LWIR pixels to avoid optical loss. MWIR radiation absorptive long wave pass filter means are disposed in the optical path to the LWIR detector array to prevent response of the LWIR pixels to MWIR radiation.

In addition, an integrated multiplexer (MUX) for the MWIR detector array for readout of the MWIR radiation image is provided, laterally displaced from the optical paths to the pixels of both detector arrays to avoid optical loss, and an integrated LWIR MUX is provided disposed beyond the optical paths to enable the LWIR radiation image to be readout simultaneously with the MWIR radiation image.

Further in accordance with the invention, the first substrate is of (111) Cadmium Zinc Telluride (CdZnTe), and the first and second semiconductor layers are of mercury cadmium telluride (MCT) applied respectively to the (111)B and (111)A faces of the substrate. The first semiconductor layer is a molecular beam eptaxial (MBE), planar processed layer of the p-type with patterned n-type diffusions to provide an array of MWIR radiation sensitive, planar processed PV diode pixels, and the second semiconductor layer is a liquid phase epitaxial (LPE), planar processed layer of the p-type with patterned n-type diffusions to provide an array of LWIR radiation sensitive, planar processed PV diode pixels.

In accordance with a second embodiment, mesa processed PV diodes pixels are employed for the MWIR detector array. In the second embodiment, the first semiconductor layer is a composite of two molecular beam epitaxially grown sub-layers, one sub-layer being extrinsically doped n-type, and the other sub-layer being extrinsically doped p-type. The sub-layers are then patterned to provide an array of MWIR radiation sensitive, mesa processed PV diode pixels. The PV diode pixels of the LWIR detector array in the second embodiment are planar processed as in the first embodiment.

In both embodiments, the linear MWIR and LWIR detector arrays are preferably staggered element arrays comprising odd rows and even rows of pixels, the pixels in the odd rows being displaced one half pixel period in the resolution direction with respect to the pixels in the even rows to provide continuous coverage (with no gaps) of the object field. The odd rows of each linear array, and the even rows of each linear array can have multiple pixels, with the rows in each odd and in each even set of rows being displaced in the optical scan direction for time delay integration (TDI) operation.

The focal plane assembly has four principal parts or substrates supporting the integrated circuitry: a first substrate for the MWIR and LWIR detector arrays, a second substrate for the LWIR MUX and a third and fourth substrate for the MWIR MUX. The LWIR MUX is disposed on a second substrate beyond the optical paths and indium bumped to the second face of the first substrate, and the MWIR MUX is formed on two substrates, one substrate being disposed beside the odd row set of the MWIR detector array and the other substrate being disposed beside the even row set of the MWIR detector array.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
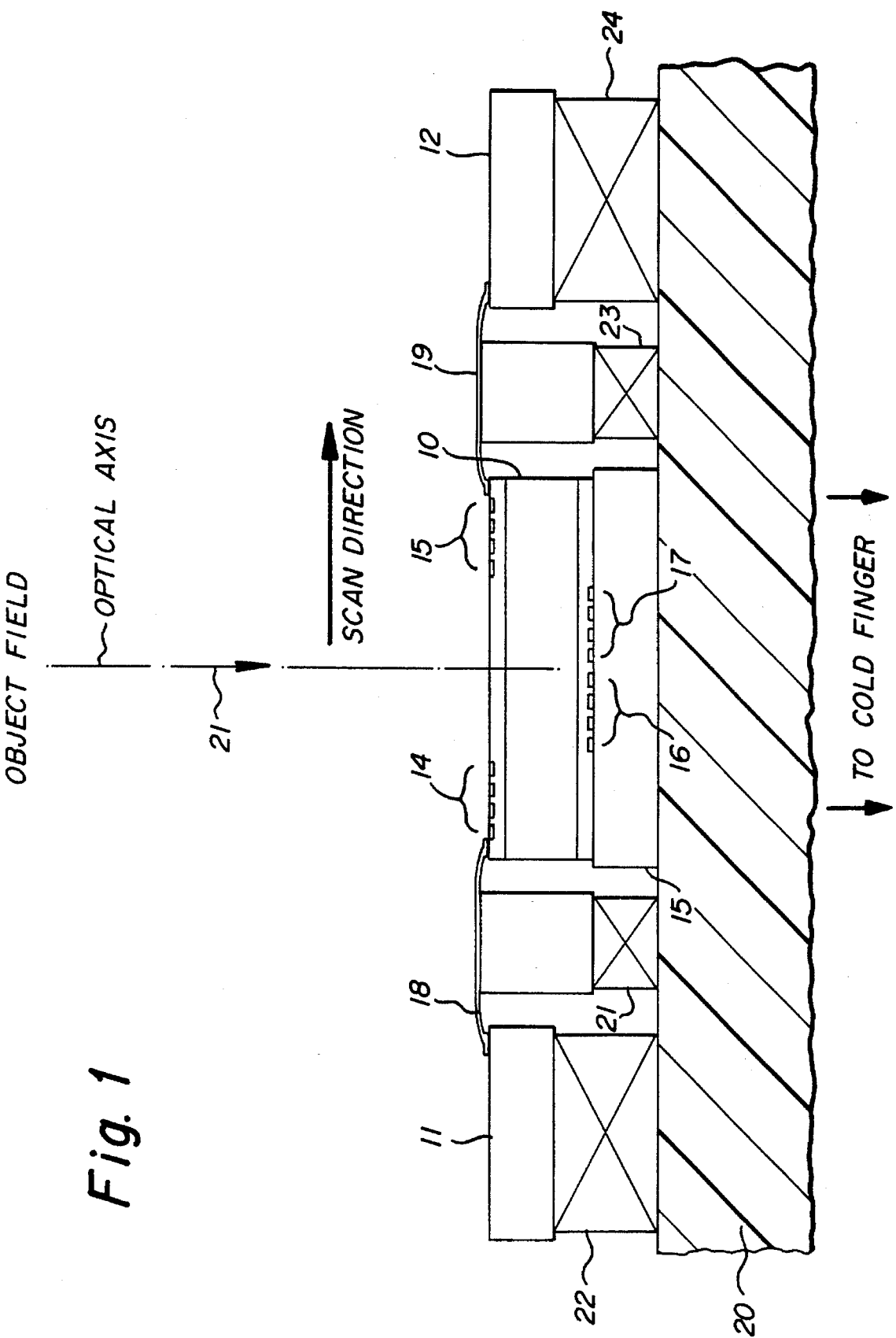
FIG. 1 is a cross-sectional view of a novel infrared (IR) scanning focal plane assembly in which medium wave and long wave IR (MWIR, LWIR) images of the same object field are simultaneously derived from two linear MWIR and LWIR detector arrays monolithically integrated on the front and back faces respectively of the same substrate.

A novel infrared (IR) focal plane assembly in which medium wave and long wave IR (MWIR, LWIR) images of a scanned object field are simultaneously read out, is shown in FIG. 1. The focal plane assembly, which includes two close spaced linear MWIR and LWIR detector arrays, is a part of an IR camera or sensor system having conventional scanning optics and conventional means for cryogenic operation.

As the camera system scans the object field, successive narrow sectors of the object field are imaged by the optics upon the two close-spaced linear detector arrays. Azimuthal scanning typically involves rotating the field of view of the camera system about a vertical axis, to which the major axes of the linear detector arrays are parallel, a process which captures an image of the object field, sector by sector. Two separate, sequential electrical signals are obtained during scanning which when reconstructed in the MWIR and LWIR multiplexers form two "video" signals. The video signals may then be used to create two two-dimensional images of the object field, one in MWIR radiation and the other in LWIR radiation.

Referring to FIG. 1, the two linear IR sensitive detector arrays are monolithically integrated on a single substrate 10. The substrate, which is IR transparent, is disposed on the axis of the optical system at the focal plane of the objective lens. Focused infrared radiation from the object field proceeds from the object field toward the focal plane in the direction of the arrow 21, shown on the optical axis, impinging first on the surface of the substrate 10 on which the MWIR detector array (14, 15) is located i.e., the "first face", passing through the substrate, and impinging next on the surface of the substrate on which the LWIR detector array (16, 17) is located, i.e., the "second face". The "first face" will be referred to hereinafter as at the front of the substrate, and the MWIR detector array will be described as "front side illuminated". Similarly, the "second face" is at the "back" of the substrate, and the LWIR detector array is "back side illuminated".

The objective lens, which is not shown, should be of a suitably long focal length, of appropriate aperture, and suitably corrected at the respective wavelengths so that both the medium wave and long wave detector arrays, which are in slightly displaced planes (being on opposite sides of the same substrate), are exposed to properly focussed IR images. Cryogenic operation is provided by a cold finger used to cool the arrays. The cold finger acts through a supporting "hybrid" substrate 20. A dewar and cold shield, which are not illustrated, together with the cold finger maintain the arrays at the low temperature (65K to 78K) necessary for operation in the presence of the usual higher ambient (300K) unfocused background radiation.

The dual band focal plane assembly is an assembly of four integrated circuits or "chips" (10, 11, 12, 13). As already noted, the linear (MWIR and LWIR) detector arrays are monolithically integrated on the front side and back side respectively of the IR transparent CdZnTe substrate 10, at the center of the assembly. Monolithic construction of the two detector arrays on the common substrate 10 provides accurate (and mechanically locked) alignment of pixel rows between the MWIR and LWIR arrays. In addition, the overall mechanical complexity of the focal plane assembly is reduced compared to a system utilizing separate, mechanically aligned substrates for the MWIR and LWIR arrays.

Figure 2:
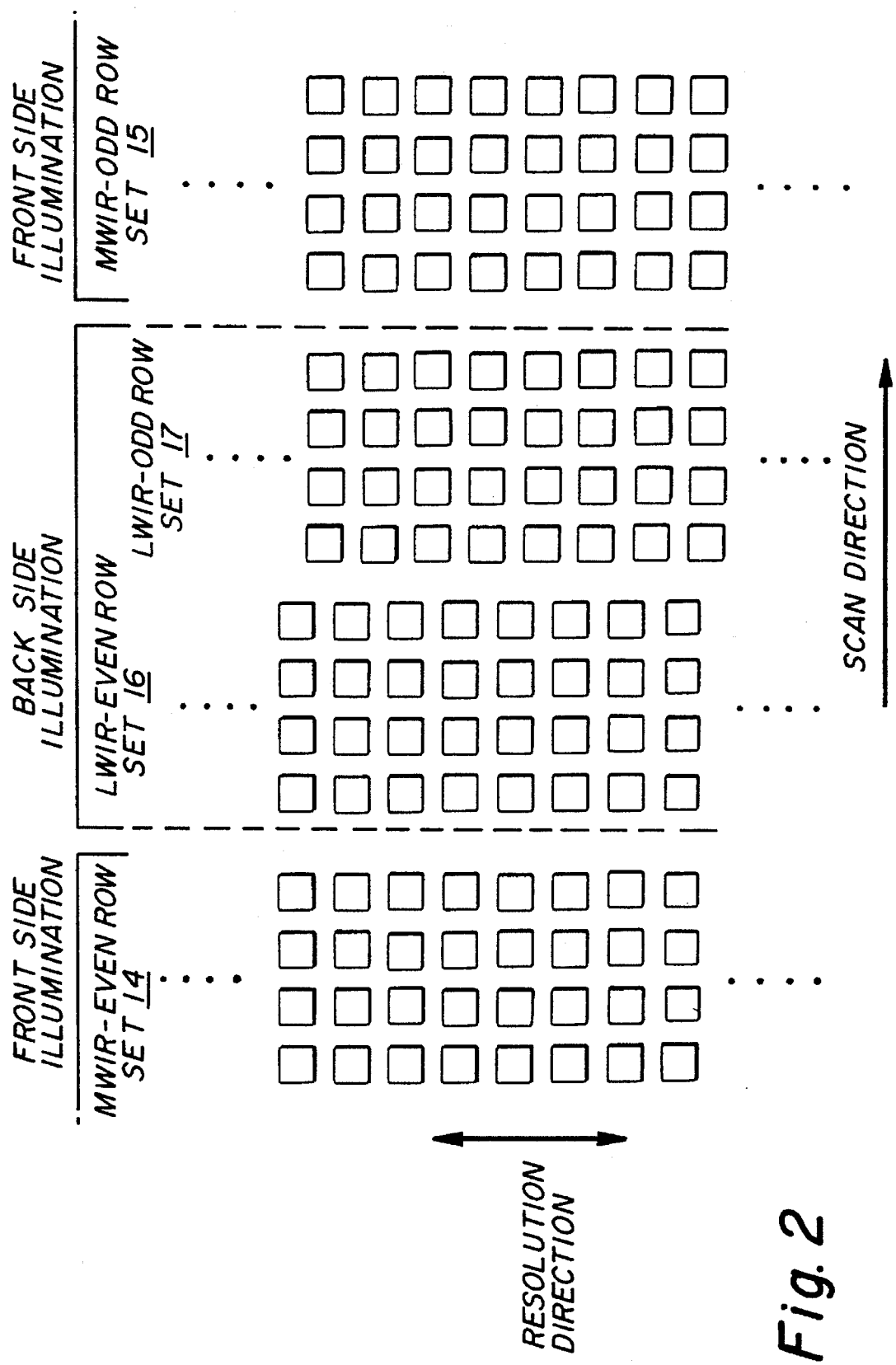
FIG. 2 is a plan view of a portion of the pixels of the two close spaced linear MWIR and LWIR detector arrays of the focal plane assembly, illustrating their spatial relationship, and their arrangement into even and odd sets of plural rows.

As shown in FIG. 2, which is an array segment showing pixel locations, the close spaced linear MWIR (14,15) and LWIR (16, 17) detector arrays are arranged into even and odd sets of plural rows of pixels, a disposition which, as will be seen, dictates the placement of the associated readout multiplexer chips (MUXes) 11, 12, 13. The pixels of both linear detector arrays are photovoltaic (PV) diodes which require individual MUX input connections, rather than buses connecting groups of pixels together. The design of the multiplexers for PV diode pixels is well known, and contains the individual preamplifiers and associated circuitry required for each pixel.

On the front side of the substrate 10, the even rows 14 of the MWIR pixels are spaced from the odd rows 15 of the MWIR pixels by a distance measured from the optical axis great enough to be clear of the optical path of the image to the back side illuminated LWIR odd and even pixel rows (16, 17), which are close-spaced together. Connections to the pixels of the even MWIR rows 14 are led away from the optical axis to contacts at the edge of the substrate 10 nearest to the even row MWIR MUX 11. These contacts are connected via the silicon beam lead interconnect (SBLI) 18 to the even row MWIR MUX 11, which possesses a row of contacts at the edge near the SBLI 18. Similarly, the connections to the pixels of the odd MWIR rows 15 are led away from the optical axis to contacts at the edge of the substrate nearest to the odd row MWIR MUX 12. These contacts are connected via the SBLI 19 to the odd row MWIR MUX 12, which possesses a row of contacts at the edge near the SBLI 19.

Figure 4:
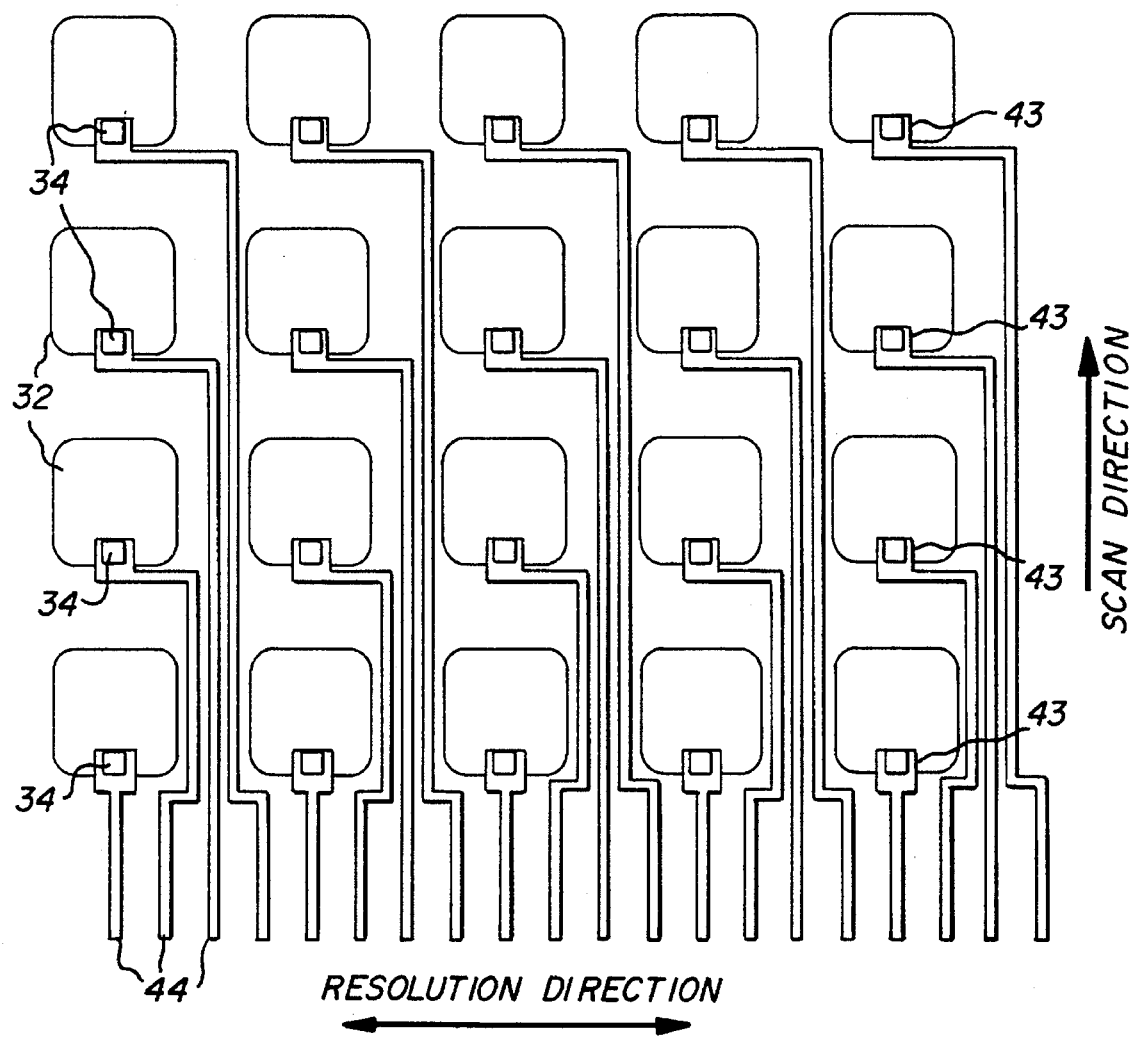
FIG. 4 is a plan view of the opaque conductor runs to a set of MWIR PV diode pixels, illustrating the routing of the opaque conductors between pixels to avoid optical loss.

The arrangement so far described places the flanking even and odd row MWIR MUXes 11, 12 and the respective SBLIs 18 and 19 on either side of the optical path of both the MWIR and LWIR images, and, as shown in FIG. 4, permits the connections to the individual MWIR pixels to be routed between these pixels so as to avoid optical loss. Since the MWIR pixels themselves stay clear of the optical paths to the underlying LWIR pixels, no optical loss to the LWIR pixels occurs from the MWIR linear detector array per se or from its components or by interconnections.

Figure 3:
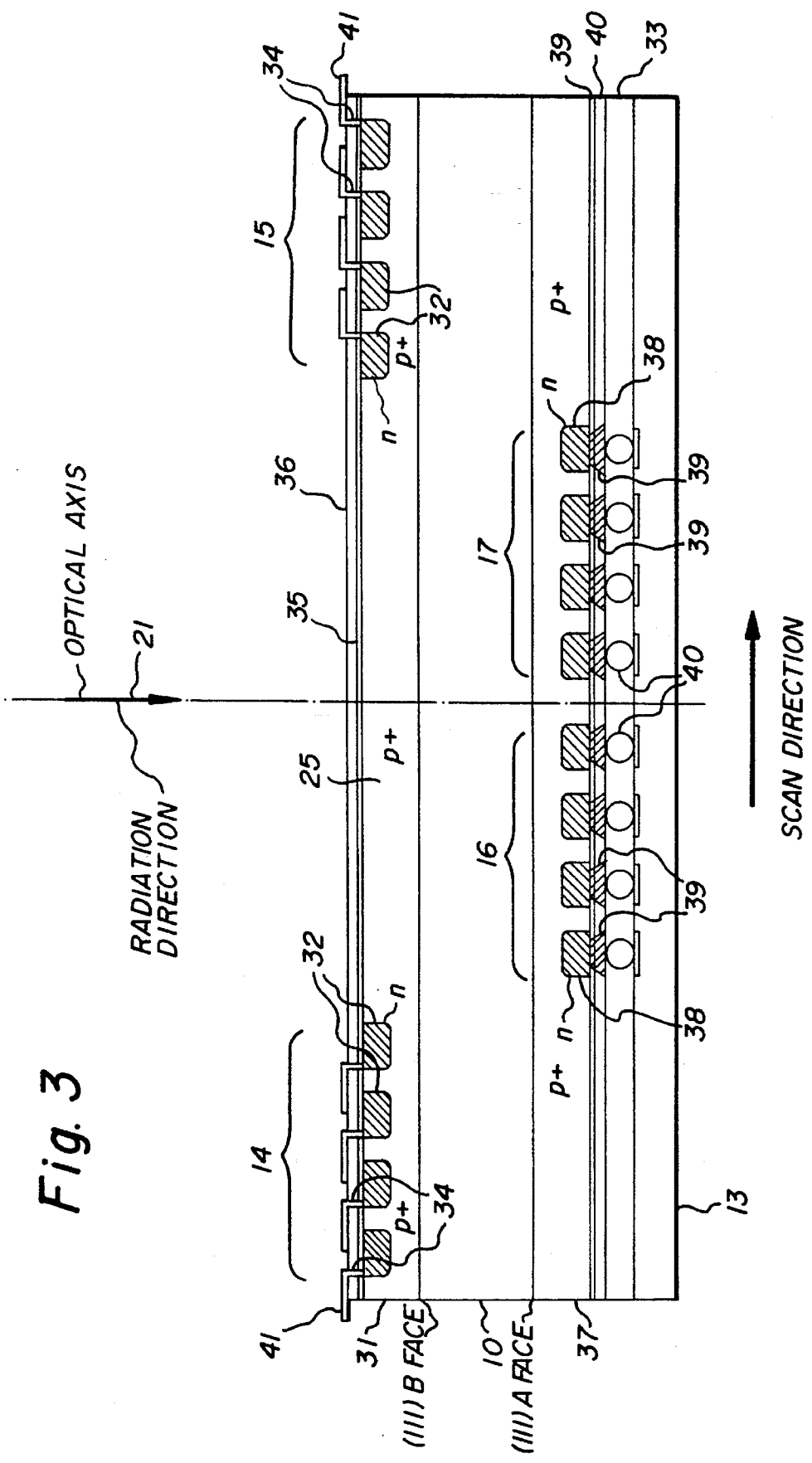
FIG. 3 is a detailed cross-sectional view of the photovoltaic (PV) diodes making up the pixels of the linear MWIR and LWIR detector arrays, both detector arrays employing diffused planar, homojunction diodes in accordance with a first embodiment of the invention.

On the back side of the substrate 10, FIG. 3, the pixels of the even rows 16 and odd rows 17 of the LWIR array are electrically connected by Indium bumps 40 to a LWIR MUX 13 at the back of the substrate 10. The bumps, supplemented by an adhesive filler 33, provide mechanical and thermal bonding between the LWIR MUX 13 and substrate 10. The LWIR MUX 13, which must make contact with each pixel of the LWIR detector array (16,17) being beyond the optical paths to the LWIR pixels, does not require a layout avoiding photosensitive pixel sites, but may fully occupy the area behind the even and odd rows of pixels.

The focal plane assembly, including the MUXes 11, 12 and 13 and the substrate 10, is mechanically assembled upon the hybrid substrate 20, which is itself an extension of the cold finger (not separately shown). The (111) CdZnTe substrate 10 bearing the MWIR and LWIR linear detector arrays and the LWIR MUX is at the center of the assembly shown in FIG. 3. The SBLI 18 and even row MWIR MUX 11, FIG. 1, are mechanically attached to the substrate 20 through ceramic spacers 21, 22 respectively. The spacers 21, 22 are selected to provide a substantially coplanar connection path from the contacts to the even rows 14 of the MWIR detector array to the contacts of the even row MWIR MUX 11. The SBLI 19 and odd row MWIR MUX 12 are also mechanically attached to the substrate 20 through ceramic spacers 23, 24 respectively, with the spacers providing nearly coplanar connection paths between the contacts of the odd rows 15 of the MWIR detector array and the contacts of the odd row MWIR MUX 12.

The arrangement provides spectral separation of the MWIR and LWIR images. As already discussed, the focused (MWIR and LWIR) radiation is incident first on the MWIR and secondly on the LWIR linear detector array which are mutually offset from one another so that both have unobstructed optical paths and each provides a spectrally separate output. The front surface of the substrate 10 upon which the two arrays are formed, is provided with an IR anti-reflective coating (not shown) to enhance optical performance. Since the substrate 10 is transmissive of both MWIR and LWIR radiation, spectral image separation at the LWIR detector array is required by an MWIR absorbent filtering means 25 placed in front of the LWIR detector array. The filter 25 can be realized by an unelectroded and unpatterned extension of the MWIR sensitive layer 31. This layer 31, which is best seen in FIG. 3, has a composition and sufficient thickness to absorb the higher energy MWIR photons, while allowing the lower energy LWIR photons to pass through. The IR radiation stripped of MWIR radiation by layer 25, and containing only LWIR radiation, passes through the CdZnTe substrate 10 to the LWIR detector array (16,17) on the back side of the substrate where the optical paths end. Due to the filtering, only the LWIR radiation image appears in the LWIR detector output.

Similarly, the MWIR detector array provides a spectrally separate output, responding only to MWIR radiation. The layer 31, and the diffusions 32, which form the photodiodes, are formed of a wide band gap material, which does not respond (i.e. create electron hole-pairs) to the lower energy LWIR radiation. Accordingly, the MWIR and LWIR detectors respond only to their respective IR bands, and the video appearing at the outputs of the MWIR MUXes 11, 12 and the LWIR MUX 13 contain spectrally separate signals.

The physical structure of the linear MWIR and LWIR detector arrays 13, 14, which are monolithically integrated on the faces of the CdZnTe substrate 10, is best seen in FIG. 3. The CdZnTe substrate 10 has a (111) crystallographic orientation. The front side illuminated MWIR PV diode detector array (14,15) is formed on an MCT layer 31, grown by the MBE process on the (111)B face of the substrate 10 and the back side illuminated LWIR PV diode detector array (16,17) is an MCT layer grown by the LPE process on the (111)A face of the substrate 10. The CdZnTe substrate has a nominal 10–20 mils thickness, the thickness being selected to achieve the necessary robustness to maintain the integrity of the MWIR, LWIR detector arrays formed thereon and to permit their electrical connection to the MUXes during fabrication of the focal plane assembly. The CdZnTe substrate 10 is substantially transparent to LWIR image radiation which must reach the underlying LWIR array, and thus the thickness is set primarily by mechanical and other considerations. The 10–20 mil CdZnTe substrate is available commercially with a (111) crystalographic orientation.

Referring to FIG. 3, the MWIR PV diode detector array 14, 15 is formed in the mercury cadmium telluride (MCT) layer 31 grown by the MBE process on the (111)B front face of the CdZnTe substrate 10. The LWIR PV diode detector array 16, 17 is formed in an MCT layer 37 grown by the liquid phase epitaxial (LPE) process on the (111)A back face of the substrate 10 on which surface the LPE process provides accurate replication of the crystalline structure.

The molecular beam epitaxial (MBE) process produces a layer which accurately replicates the (111)B crystalline structure on the front face of the CdZnTe substrate. The MBE process is carried out at a relatively low temperature (~200° C.) and does not disturb the earlier LPE formed MCT layer on the back face of the substrate 10, deposited at much higher temperatures. The front (111)B face of the CdZnTe substrate is the preferred face for MBE deposition of MCT, allowing the LPE layer 3 for the LWIR detector array to be grown on the back (111)A face, which is the preferred face for LPE growth of MCT.

The PV diodes of the MWIR and LWIR detector arrays are of a similar structure, and after the initial formation of the MCT layers 31, 37 by the MBE and LPE processes respectively, are similarly processed. The band gap of the MBE MCT layer 31 is determined by the initial composition which is optimized for MWIR absorption. Similarly the band gap of the LPE MCT layer 37 is determined by the initial composition which is optimized for LWIR absorption. Neither band gap is affected by the subsequent diffusions of n regions which do affect the sign and quantity of electrical carriers.

After growth, the layers 31, 37 are annealed to create a controlled p-type conductivity by the formation of mercury vacancies until a carrier concentration of approximately $10^{17}$ cm$^{-3}$ is achieved. The p-type layers 31, 37 are each coated with a passivation layer 35, 39, typically cadmium telluride (CdTe), and a dielectric layer, 36, 40, typically zinc sulfide (ZnS), the latter being applied over the passivation layer. The second anneal diffuses additional mercury into the pixel locations to fill the previously created mercury vacancies and form isolated n-type regions 32, 38 within the p-type layers 31, 37 to form n on p planar photovoltaic diodes. The n-type regions have a carrier concentration of approximately $10^{15}$ cm$^{-3}$. Subsequently ohmic contacts 34, 39 are provided for connection to the n regions of both the MWIR to LWIR arrays, leading these contacts through the passivation and dielectric layers. The MWIR detector contacts 34 are then connected via the surface metallization 41, shown in a plan view of the even rows in FIG. 4, to the SBLIs 18, and 19. The connections then lead via the SBLIs to the MWIR MUXes as already noted. On the underside of substrate 10, the LWIR contacts 39 are connected by indium bumps 40 to the LWIR MUX 13.

An exemplary layout of the individual electrical connections to the PV diode pixels of the even rows 14 of the MWIR detector arrays and leading to the SBLI 18 is provided in FIG. 4. The electrical output of each PV diode is in the form of a continuous current, instantaneously proportional to the incident IR flux. The PV diode current is very small and requires electrical amplification for each pixel prior to further processing. The MWIR even (11) and odd row (12) MUXes, accordingly, are arranged to provide amplification for each pixel signal prior to multiplexing the individual pixel signals into a single video signal. In the illustrated sample, the electrical connections to the n region of each PV diode pixel of an even row set in a 4 row TDI MWIR detector array is shown. (The p region contact is not shown.)

FIG. 4 is a plan view of the surface metallization 41 shown as broken lines in the cross section view of FIG. 3. FIG. 4 shows a 5×4 selection of adjacent pixels; five pixels counting in the resolution direction and 4 rows of pixels counting in the scan direction. As earlier noted, the 4 rows permit 4 deep TDI operation. The 20 approximately rectangular features are the n-diffusions 32, defining the individual PV diodes, within the slightly larger active photosensitive regions of each pixel. The small rectangular pads 43 of the metallization 41 form a surface connection to the individual n-region contacts 34 (FIG. 3) which pass upward through the passivation and dielectric layers 35 and 36. The metallization 41 provides surface connections to the pixel pads 43 proceeding parallel (and opposite) to the scan direction from an individual pixel, and then continuing between the pixels to an evenly spaced sequence of similarly shaped conductor runs 44. The conductor runs 44 continue from proximity to the PV diode pixels to pads (not shown) at the edge of the substrate 10 to which the beam leads of the SBLI are bonded. The conductor runs act to space the heat and pressure sensitive pixels from the pads to which beam leads of the SBLI 18 are bonded.

Since the metallization runs 41 connecting both even and odd sets of the MWIR detector pixels to the even and odd MWIR MUXes proceed away from the optical axis toward the flanking MUXes, there is no interference between MWIR and the underlying LWIR arrays as already noted. The even and odd row sets of pixels of the LWIR detector array are separated by slightly more than the distance between pixels, while the separation between even and odd row sets of pixels of the MWIR array may be on the order of 10 pixel intervals. This separation is still quite small, permitting both linear detector arrays to be treated as "close spaced" in the design of the optical scanner and image processor.

Figure 5:
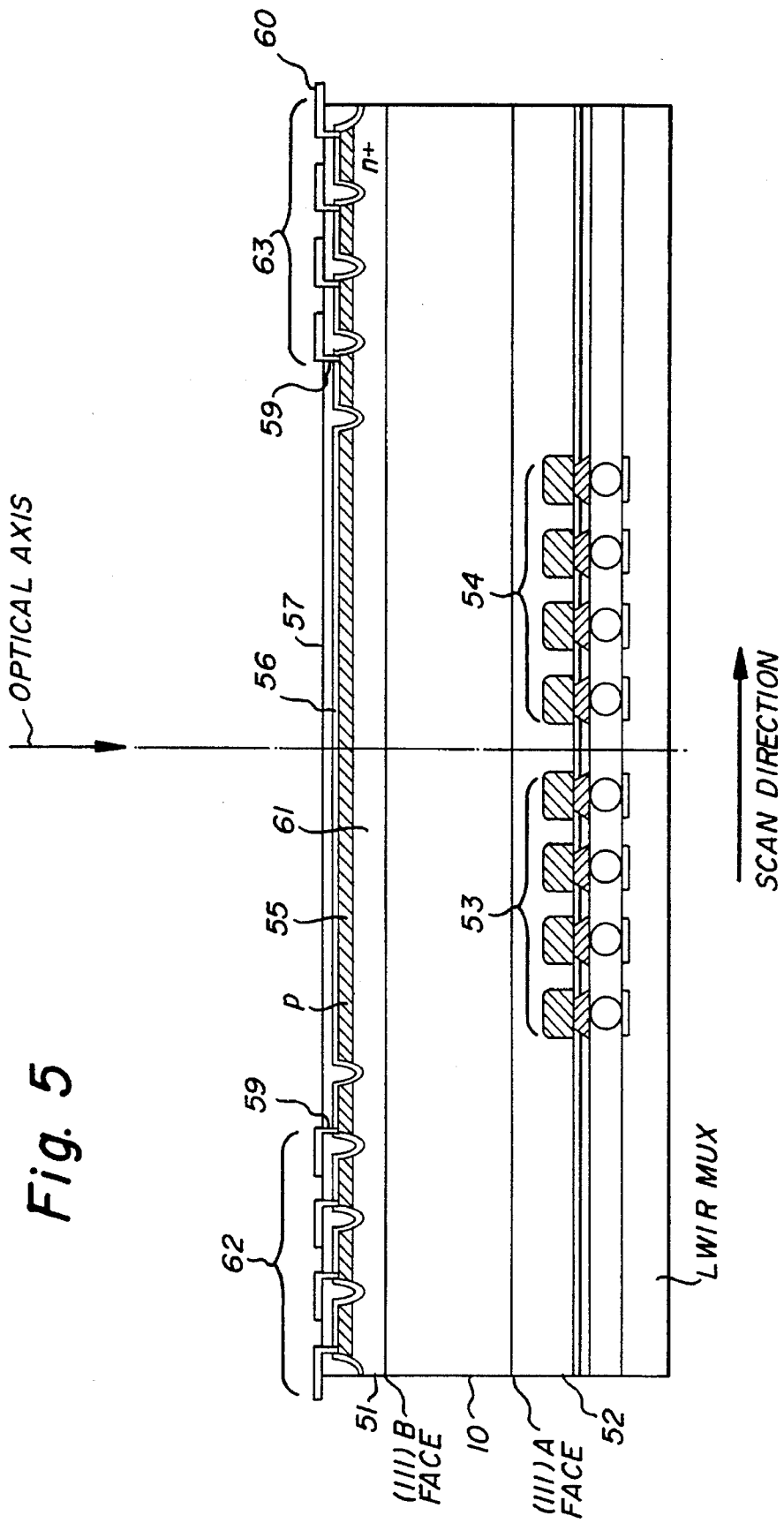
FIG. 5 is a detailed cross-sectional view of the photovoltaic (PV) diodes making up the linear MWIR and LWIR detector arrays, the MWIR detector array employing extrinsically doped mesa homojunction diodes and the LWIR detector array employing diffused planar, homojunction diodes in accordance with a second embodiment of the invention.

A second embodiment of the invention is shown in FIG. 5. In this embodiment the placement of the MWIR and LWIR pixels is in even and odd plural rows substantially as shown in FIG. 3. The LWIR pixels of the second embodiment, which utilize diffused planar diodes, are also of the same design as in the first embodiment. However, the pixels of the MWIR detector array in the second embodiment are extrinsically doped mesa processed PV diodes rather planar processed PV diodes.

Referring to FIG. 5, an n-type MCT layer 51 optimized for MWIR radiation detection is formed by the MBE process on the front (111)B face of the CdZnTe (111) substrate 50. As in the first embodiment, an n-type MCT layer 52 is also formed by the LPE process on the back (111)A face of the substrate 50, prior to the formation of sub-layers 51 and 55. The PV diodes of the LWIR linear detector array 53, 54 of the second embodiment, are of the same construction as in the first embodiment. The base sub-layer 51 on the front face is then followed with a capping sub-layer 55 to form either p on n or n on p photovoltaic diodes, depending upon the dopant used during sub-layer growth.

In the p on n arrangement shown in FIG. 5, n type conductivity is achieved by adding indium during layer growth to achieve an impurity level of approximately $10^{15} cm^{-3}$ in a continuous MBE process in which the p type sub-layer 55 is subsequently formed. In this MBE process, the n type sub-layer 51 ends as the indium source oven is turned off and an arsenic source oven is turned on. The p-type sub-layer 55 is doped to achieve an impurity level of approximately $10^{17} cm^{-3}$.

After MBE deposition of n- and p-type sub-layers, an anneal step, usually conducted simultaneously with the n-type anneal of the LPE layer, is used to fill in any residual mercury vacancies in the MCT lattice. Subsequent etching below the p-type region (p on n junction) creates the mesas defining the individual pixels. The passivation 56, and dielectric 57 layers, contacts 59 and contact runs 60 may be essentially of the same composition as in the first embodiment.

As in the first embodiment, the layers 51, 55 on the (111)B face of the CdZnTe substrate continue between the even and odd rows of pixels of the MWIR linear arrays which are to either side of the optical path to the LWIR pixels. The central portion (61) of the layers 51, 55, between the sets of even and sets of odd MWIR rows, is unelectroded and unetched except around its perimeter. This portion 61 is absorptive of MWIR radiation and acts as a long-wave pass optical filter disposed in the optical path to the LWIR detector array to prevent response of the LWIR pixels to MWIR radiation as in the first embodiment. The mesa processed PV diodes of the MWIR detector array (62,63) are responsive only the MWIR radiation band, thus achieving spectrally separate responses at the two arrays.

In each of the first and second embodiments, the MBE processed MCT layer, in which the PV diode pixels of the MWIR array are formed, is applied to the (111)B front face of the (111) CdZnTe substrate, while the LPE processed MCT layer, in which PV diode pixels of the LWIR array are formed, is applied to the (111)A back face of the (111) CdZnTe substrate. In each embodiment, the MCT layers are applied to the face of the substrate having the preferred crystalline orientation for layer growth by the indicated process. That being so, both MWIR and LWIR arrays may be fabricated on the same chip.

The structural arrangement in which the MWIR detector array is in front, and LWIR array is in back, achieves spectral separation of the two array outputs very simply. PV diode pixels formed in the MWIR responsive layer, by control of the MBE process, do not respond to lower energy LWIR radiation, and at the same time the MWIR responsive layer may be designed to absorb the MWIR radiation, preventing it from impinging on the LWIR pixels and producing an unwanted response.

What is claimed is:

1. In a dual band IR sensor having a predetermined optical scan direction and predetermined optical axis, and in which optically scanned medium wave and long wave infrared (MWIR, LWIR) images of the same object field are simultaneously readout, a monolithic, IR focal plane assembly, comprising:

(A) an LWIR transmissive crystalline first substrate having a first face oriented for front side illumination and a second face oriented for back side illumination (B) an integrated MWIR radiation sensitive linear detector array, the MWIR detector array including a first plurality of photovoltaic (PV) first diode pixels forming first resolution elements aligned orthogonal to the optical scan direction of the sensor, said first diode pixels being formed from a first semi-conductor layer epitaxially grown on said first face of a material suitable for MWIR radiation sensing and insensitive to LWIR radiation:

(C) an integrated LWIR radiation sensitive linear detector array, the LWIR detector array including a second plurality of PV second diode pixels forming second resolution elements aligned parallel to and close spaced from said MWIR detector array, said LWIR detector array being formed from a second semiconductor layer epitaxially grown on said second face of a material suitable for LWIR radiation sensing, the first pixels being laterally displaced from the optical paths to said second pixels to avoid optical loss;

(D) MWIR radiation absorptive long wave pass filter means disposed in the optical path to said LWIR detector array to prevent response of the second pixels to MWIR radiation;

(E) an integrated multiplexer (MUX) for said MWIR detector array laterally displaced from the optical paths to the first and second pixels of the MWIR and LWIR detector arrays to avoid optical loss;

(F) conductive means interconnecting the individual first pixels of said MWIR detector array to said first MUX to enable readout of the MWIR radiation image, said conductive means being routed between individual MWIR array pixels, thus avoiding optical loss; and (G) a second integrated MUX disposed beyond the optical paths to said LWIR detector array and electrically connected to individual PV second diodes thereof to enable the LWIR radiation image to be readout simultaneously with MWIR1 radiation image.

2. The combination set forth in claim 1 wherein:

said first substrate is of Cadmium Zinc Telluride (CdZnTe).

3. The combination set forth in claim 2 wherein:

said first and second semiconductor layers are of mercury cadmium telluride (MCT).

4. The combination set forth in claim 3 wherein:

said first substrate is of a (111) crystallographic orientation, the (111)B face being and first face and the (111)A face being said second face.

5. The combination set forth in claim 4 wherein:

said first semiconductor layer is a molecular beam epitaxial (MBE) layer, and said second semiconductor layer is a liquid phase epitaxial (LPE) layer.

6. The combination set forth in claim 5 wherein:

said first semiconductor layer is of the p-type with patterned n-type diffusions to provide an array of MWIR radiation sensitive, planar processed PV-first diode pixels; and said second semiconductor layer is of the p-type with patterned n-type diffusions to provide an array of LWIR radiation sensitive, planar processed PV second diode pixels.

7. The combination set forth in claim 6 wherein:

first semiconductor layer has a wide band gap for MWIR radiation sensing, and said second semiconductor layer has a narrow band gap for LWIR radiation sensing.

8. The combination set forth in claim 7 wherein:

said first and second semiconductor layers have a mercury vacancy concentration adjusted to achieve a p-region carrier concentration on the order of $10^{17}$ cm$^{-3}$ and an n-region carrier concentration on the order of $10^{15}$ cm$^{-3}$.

9. The combination set forth in claim 5 wherein:

said first semiconductor layer is a composite to two molecular beam epitaxially grown sub-layers, one sub-layer being extrinsically doped n-type, and the other sub-layer being extrinsically doped p-type, said sub-layers being patterned to provide an array of MWIR radiation sensitive, mesa processed PV first diode pixels, and said second semiconductor layer is p-type with patterned n-type diffusions to provide an array of LWIR radiation sensitive, planar processed PV second diode pixels.

10. The combination set forth in claim 9 wherein:

the band gaps of said sublayers of said first semiconductor layer are the same and are suitable for MWIR radiation sensing, and said second semiconductor layer has a narrow band gap for LWIR radiation sensing.

11. The combination set forth in claim 10 wherein:

said p-type sublayer of said first semiconductor layer is doped with arsenic to a carrier concentration of approximately $10^{17}$cm$^{-3}$ and said n type sublayer of said first semiconductor layer is doped with indium to a carrier concentration of approximately $10^{15}$ cm$^{-3}$.

12. The combination set forth in claim 1 wherein:

said linear MWIR detector array having a predetermined first resolution direction includes a staggered element array comprising odd row and even rows of first pixels, the first pixels in the odd rows being displaced one half pixel period in the first resolution direction with respect to the first pixels in the even rows to provide continuous coverage to the object field;

said linear LWIR array having a predetermined second resolution direction includes odd rows and even rows of second pixels, the second pixels in the odd rows being displaced one half pixel period in the second resolution direction with respect to the second pixels in the even rows to provide continuous coverage of the object field: and said MWIR array is separated into two parts, one part comprising odd row first pixels and the second part comprising even row first pixels, and said first MUX is also separated into two parts, one part for odd row first pixels, and the second part for even row first pixels.

13. The combination set forth in claim 12 wherein:

the set of odd rows and the set of even rows of said LWIR array are placed to either side of the optical axis and separated by a distance on the order of the distance between rows of one set; and the set of odd rows and the set of even rows of said MWIR array are placed to either side of the optical axis and separated by a distance great enough to provide between them a clear optical path to said second pixels.

14. The combination set forth in claim 12 wherein:

the odd rows of each linear array, and the even rows of each linear array have multiple pixels, with the rows in each odd and in each even set of rows being displaced in the optical scan direction for time delay integration (TDI) operation.

15. The combination set forth in claim 12 wherein:

said second MUX is disposed on a second substrate beyond the optical paths and indium bumped to said second face of said first substrate; and said first MUX has said one part disposed on a third substrate and said second part disposed on a fourth substrate, said third and said forth substrates being disposed beside said odd and even row(s) respectively of said MWIR direction array.

* * * * *